United States Patent
Raghunathan et al.

(10) Patent No.: US 11,054,597 B2
(45) Date of Patent: Jul. 6, 2021

(54) ELECTRO-OPTICAL PACKAGE AND METHOD OF FABRICATION

(71) Applicant: ROCKLEY PHOTONICS LIMITED, London (GB)

(72) Inventors: Vivek Raghunathan, Mountain View, CA (US); Vivek Raghuraman, Santa Clara, CA (US); Karlheinz Muth, Richardson, TX (US); David Arlo Nelson, Fort Collins, CO (US); Chia-Te Chou, Pasadena, CA (US); Brett Sawyer, Pasadena, CA (US); SeungJae Lee, Pasadena, CA (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/382,076

(22) Filed: Apr. 11, 2019

(65) Prior Publication Data
US 2019/0317287 A1    Oct. 17, 2019

Related U.S. Application Data

(60) Provisional application No. 62/656,757, filed on Apr. 12, 2018, provisional application No. 62/829,519, filed on Apr. 4, 2019.

(51) Int. Cl.
*G02B 6/12* (2006.01)
*G02B 6/43* (2006.01)
(Continued)

(52) U.S. Cl.
CPC ............... *G02B 6/43* (2013.01); *G02B 6/426* (2013.01); *G02B 6/428* (2013.01); *H01L 25/167* (2013.01);
(Continued)

(58) Field of Classification Search
CPC .......... H01L 25/167; G02B 6/12; G02B 6/43; G02B 6/428; G02B 6/426; H05K 1/0274; H05K 3/30; H05K 2201/10378
See application file for complete search history.

(56) References Cited

U.S. PATENT DOCUMENTS 8,781,267 B2    7/2014  Julien et al.
8,824,837 B2 *  9/2014  Ren .................... G02B 6/132
                                                257/E21.09
(Continued)

FOREIGN PATENT DOCUMENTS

EP         2 820 461 A0    9/2013
KR     10-2017-0073706 A   6/2017
(Continued)

OTHER PUBLICATIONS

International Search Report and Written Opinion of the International Searching Authority, dated Sep. 23, 2019, Corresponding to PCT/IB2019/000382, 13 pages.
(Continued)

*Primary Examiner* — Jennifer Doan
(74) *Attorney, Agent, or Firm* — Lewis Roca Rothgerber Christie LLP

(57) ABSTRACT

An electro-optical package. In some embodiments, the electro-optical package includes a first electro-optical chip coupled to an array of optical fibers, and a first physical medium dependent integrated circuit coupled to the first electro-optical chip.

21 Claims, 21 Drawing Sheets

(51) Int. Cl.
*G02B 6/42* (2006.01)
*H01L 25/16* (2006.01)
*H05K 1/02* (2006.01)
*H05K 3/30* (2006.01)

(52) U.S. Cl.
CPC ............ *H05K 1/0274* (2013.01); *H05K 3/30* (2013.01); *H05K 2201/10378* (2013.01)

(56) References Cited

U.S. PATENT DOCUMENTS

| | | | |
|---|---|---|---|
| 9,082,745 B2 | 7/2015 | Morris | |
| 9,195,079 B2 * | 11/2015 | Doerr | G02F 1/2257 |
| 9,391,708 B2 | 7/2016 | Fincato et al. | |
| 9,490,240 B2 | 11/2016 | Lucero et al. | |
| 9,496,248 B2 | 11/2016 | Lee et al. | |
| 9,515,746 B2 | 12/2016 | Flens et al. | |
| 9,557,478 B2 | 1/2017 | Doerr et al. | |
| 9,575,267 B1 | 2/2017 | Shastri et al. | |
| 9,874,688 B2 * | 1/2018 | Doerr | G02B 6/428 |
| 9,935,088 B2 | 4/2018 | Budd et al. | |
| 2006/0177173 A1 | 8/2006 | Shastri et al. | |
| 2012/0014639 A1 | 1/2012 | Doany et al. | |
| 2013/0308898 A1 | 11/2013 | Doerr et al. | |
| 2014/0064659 A1 | 3/2014 | Doerr et al. | |
| 2014/0203175 A1 | 7/2014 | Kobrinsky et al. | |
| 2016/0013866 A1 | 1/2016 | Doerr | |
| 2016/0124164 A1 | 5/2016 | Doerr | |
| 2017/0186670 A1 | 6/2017 | Budd et al. | |
| 2019/0243066 A1 | 8/2019 | Mahgerefteh et al. | |

FOREIGN PATENT DOCUMENTS

| | | |
|---|---|---|
| WO | WO 2013/130831 A2 | 9/2013 |
| WO | WO 2013/165344 A1 | 11/2013 |
| WO | WO 2014/014846 A2 | 1/2014 |
| WO | WO 2016/077500 A8 | 5/2016 |

OTHER PUBLICATIONS

International Search Report and Written Opinion of the International Searching Authority, dated Sep. 30, 2019, Corresponding to PCT/IB2019/000383, 13 pages.
International Search Report and Written Opinion of the International Searching Authority, dated Oct. 9, 2019, Corresponding to PCT/IB2019/000607, 13 pages.
U.S. Appl. No. 16/824,609, filed Mar. 19, 2020.
U.S. Appl. No. 16/836,815, filed Mar. 31, 2020.
U.S. Office Action from U.S. Appl. No. 16/393,763, dated Mar. 18, 2020, 7 pages.
U.S. Appl. No. 16/383,309, filed Apr. 12, 2019.
U.S. Appl. No. 16/393,763, filed Apr. 24, 2019.
Website: "Silicon Wafer Integrated Fan-out Technology (SWIFT™) Packaging for Highly Integrated Products", Amkor, https://c44f5d406df450f4a66b-1b94a87d576253d9446df0a9ca62e142.ssl.cf2.rackcdn.com/2017/12/SWIFT_Packaging_for_Highly_Integrated_Products_WhitePaper_0617.pdf, printed on Apr. 8, 2018, 4 pages.
International Search Report and Written Opinion of the International Searching Authority, dated Aug. 3, 2020, Corresponding to PCT/EP2020/059637, 14 pages.

* cited by examiner

ELECTRO-OPTICAL PACKAGE AND METHOD OF FABRICATION

CROSS-REFERENCE TO RELATED APPLICATION(S)

The present application claims priority to and the benefit of U.S. Provisional Application No. 62/656,757, filed Apr. 12, 2018, entitled "PACKAGING OF OPTICAL AND ELECTRONIC COMPONENTS", and claims priority to and the benefit of U.S. Provisional Application No. 62/829,519, filed Apr. 4, 2019, entitled "OPTICAL ENGINE", the entire contents of both of which are incorporated herein by reference.

FIELD

One or more aspects of embodiments according to the present disclosure relate to packages, and more particularly to an electro-optical package and a method for fabricating such a package.

BACKGROUND

Systems combining electronic circuits with electro-optic systems for modulating light, detecting modulated light, and interfacing to optical fibers have a wide range of applications. In the design of such systems, achieving compactness and low cost may be challenging for various reasons, including the need for alignment between optical elements, thermal management, and, in some applications, requirements for high-speed operation.

Thus, there is a need for an improved electro-optical package and a method for fabricating such a package.

SUMMARY

According to some embodiments of the present invention, there is provided a system, including: a first electro-optical chip coupled to an array of optical fibers; and a first physical medium dependent integrated circuit coupled to the first electro-optical chip.

In some embodiments, the system further includes a first redistribution layer and a second redistribution layer, parallel to the first redistribution layer, the first physical medium dependent integrated circuit being between the first redistribution layer and the second redistribution layer; a first via core between the first redistribution layer and the second redistribution layer; a first optical interposer chip coupled to the array of optical fibers, the first electro-optical chip being coupled to the array of optical fibers through the first optical interposer chip; a first array of conductors secured to the first redistribution layer and to the first optical interposer chip; and a second array of conductors on an outer surface of the second redistribution layer.

In some embodiments, the first physical medium dependent integrated circuit and the first via core are part of a single silicon integrated circuit.

In some embodiments, the system further includes an overmold between the first redistribution layer and the second redistribution layer, the overmold encapsulating the first physical medium dependent integrated circuit and the first via core.

In some embodiments, the first optical interposer chip includes an array of V-grooves, each optical fiber of the array of optical fibers being in a respective V-groove.

In some embodiments, the system further includes an organic substrate having, on its surface, a plurality of conductive pads, and a socket, between the second array of conductors and the conductive pads.

In some embodiments, the socket includes an insulating layer of elastomer and a plurality of conductors extending through the insulating layer of elastomer.

In some embodiments, the first electro-optical chip includes a modulator, the system further including: a second electro-optical chip including a photodetector; and a second physical medium dependent integrated circuit coupled to the second electro-optical chip.

In some embodiments: the system includes an organic substrate and a socket, between the second array of conductors and the conductive pads; a conductive path between the first physical medium dependent integrated circuit and the organic substrate includes a portion in a conductor of the socket; and a conductive path between the second physical medium dependent integrated circuit and the organic substrate includes a portion in a conductor of the socket.

In some embodiments, the second electro-optical chip is coupled to the array of optical fibers through the first optical interposer chip.

In some embodiments: a conductive path between the first physical medium dependent integrated circuit and the organic substrate includes a portion in a conductor of the first via core; and a conductive path between the second physical medium dependent integrated circuit and the organic substrate includes a portion in a conductor of the first via core.

In some embodiments, the system further includes a second optical interposer chip, wherein the second electro-optical chip is coupled to the array of optical fibers through the second optical interposer chip.

In some embodiments, the system further includes a second via core, wherein: a conductive path between the first physical medium dependent integrated circuit and the organic substrate includes a portion in a conductor of the first via core; and a conductive path between the second physical medium dependent integrated circuit and the organic substrate includes a portion in a conductor of the second via core.

In some embodiments, a conductive path extending from the first electro-optical chip to the first physical medium dependent integrated circuit has a length of less than 500 microns.

In some embodiments, the conductive path extending from the first electro-optical chip to the first physical medium dependent integrated circuit has a length of less than 350 microns.

According to some embodiments of the present invention, there is provided a method for fabricating a package, the method including: forming a first redistribution layer on a carrier wafer; attaching a via core to the first redistribution layer; attaching a physical medium dependent integrated circuit to the first redistribution layer; molding an overmold onto the via core and onto the physical medium dependent integrated circuit; grinding an upper surface of the overmold; and forming a second redistribution layer on the upper surface of the overmold.

In some embodiments, the method further includes: removing, from the carrier wafer, an intermediate product including: the first redistribution layer the via core the physical medium dependent integrated circuit the overmold; and the second redistribution layer.

In some embodiments, the method further includes forming a plurality of conductive pillars on the second redistribution layer.

In some embodiments, the method further includes attaching an electro-optical chip to an optical interposer chip including a plurality of conductive traces, and a plurality of V-grooves.

In some embodiments, the method further includes attaching, to the optical interposer chip, an intermediate product including: the first redistribution layer; the via core; the physical medium dependent integrated circuit; the overmold; and the second redistribution layer, so as to form a conductive path through a trace of the plurality of conductive traces, from the physical medium dependent integrated circuit to the electro-optical chip.

In some embodiments, the method further includes securing an optical fiber in one of the plurality of V-grooves.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of an electro-optical package and method of fabrication provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
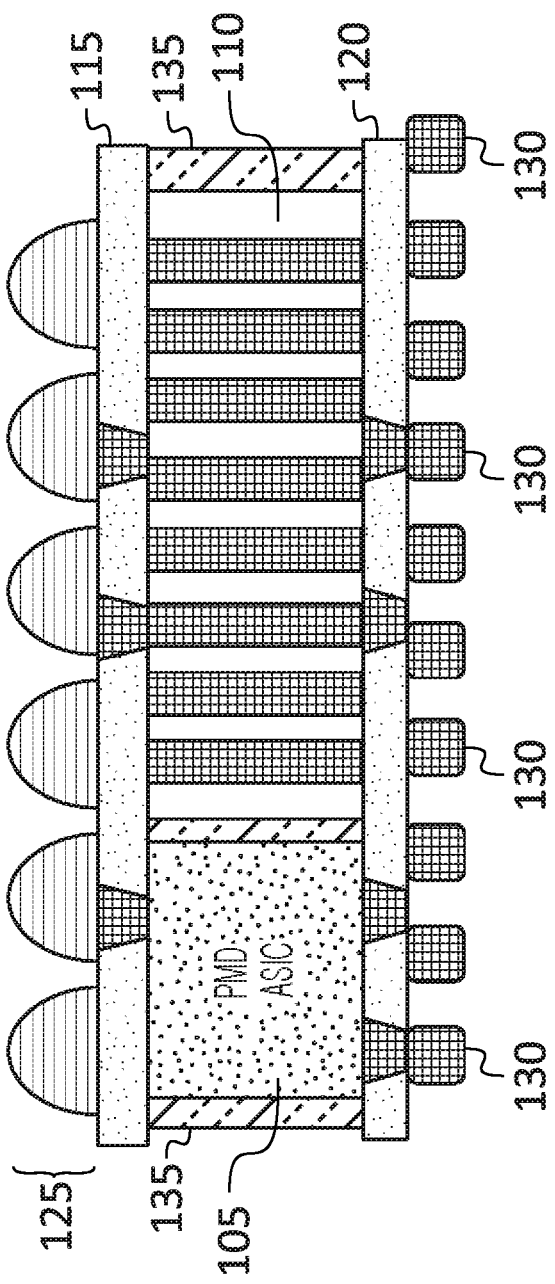
FIG. 1 is a side cross-sectional view of a fan out wafer level package, according to an embodiment of the present disclosure.

FIG. 1 shows a fan out wafer level package according to some embodiments. The fan out wafer level package includes (i) a physical medium dependent (PMD) application-specific integrated circuit (ASIC) 105, and a via core 110, sandwiched between two redistribution layers (RDLs), an upper RDL 115 and a lower RDL 120, (ii) an interconnect 125, which may be used as a first level interconnect or as a second level interconnect, on the upper RDL 115, and (iii) a plurality of copper pillars with solder cap 130, for first level interconnection, on the lower surface of the lower RDL 120. A ball grid array or a socket may be used as a second level interconnect on the upper RDL 115. In some embodiments the interconnect 125 on the upper RDL 115 is another plurality of copper pillars with solder cap, and may be suitable for use as a first level interconnect. The via core 110 may include an array of relatively tall (e.g., 150 micron-200 micron tall) copper pillars or copper vias (e.g., a square array on a 350 micron pitch) in a dielectric such as epoxy (or "mold"), copper clad FR4, glass, or silicon. In some embodiments, the PMD ASIC 105 and the via core 110 may be part of a single silicon integrated circuit (e.g., they may be fabricated in or on a single silicon substrate) (which may be referred to as a silicon interposer with active circuits). Each RDL 115, 120 may consist of a layer of polyimide with conductive traces and conductive vias; each RDL 115, 120 may in turn include a plurality of layers, i.e., it may include one or more RDLs. Each of the upper RDL 115 and the lower RDL 120 may be a composite RDL including up to four single-layer RDLs (a single layer RDL having one insulating layer, and possibly having (i) conductive traces on or both of its surfaces and (ii) conductive vias through the insulating layer). The PMD ASIC 105 may have electrical connections on its "front surface" or lower surface (in the orientation of FIG. 1), i.e., on the surface in contact with the lower RDL 120. An overmold 135 (e.g., an epoxy overmold) may encapsulate the PMD ASIC 105 and the via core 110.

Figure 2A:
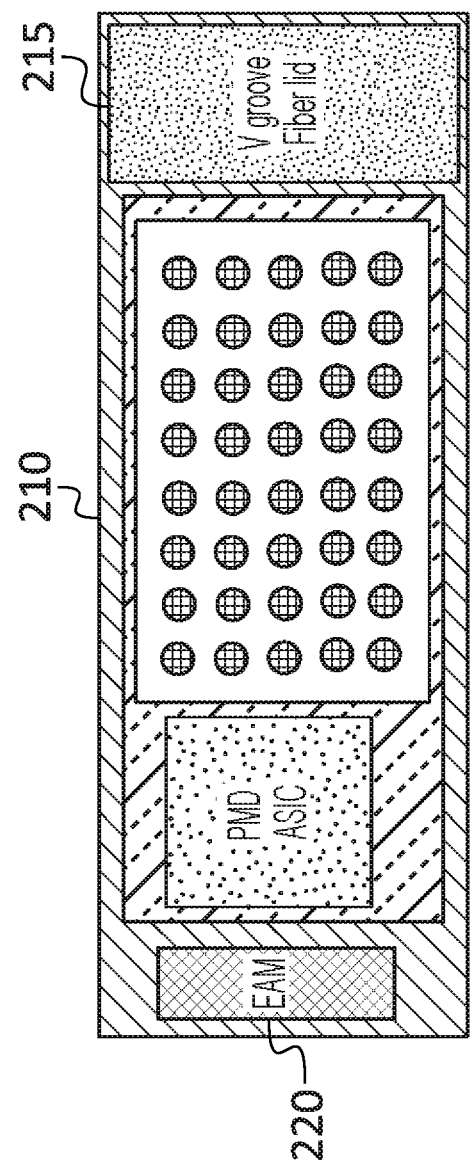
FIG. 2A is a top cross-sectional view of a package on chip structure, according to an embodiment of the present disclosure.
Figure 2B:
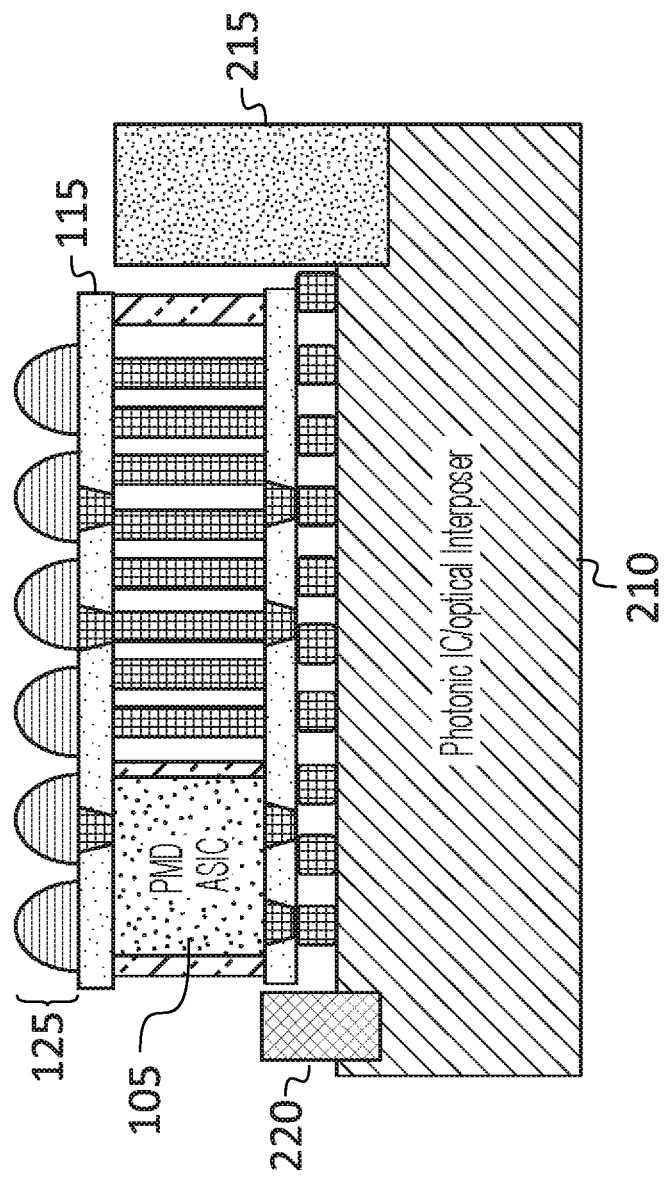
FIG. 2B is a side cross-sectional view of a package on chip structure, according to an embodiment of the present disclosure.

FIGS. 2A and 2B show a "package on chip" structure according to some embodiments. The package on chip structure includes a fan out wafer level package and a photonic integrated circuit (PIC), which in turn includes an optical interposer 210, a fiber lid 215, and an electro-optical chip 220. The electro-optical chip 220 may include a modulator array (e.g., an array of electro-absorption modulators (EAMs) as shown) and/or laser arrays (in which case the photonic integrated circuit may be referred to as a "transmitter PIC" or "TX PIC") or a photodetector array (in which case the photonic integrated circuit may be referred to as a "receiver PIC" or "RX PIC"), or both modulators (and/or lasers) and photodetectors.

The optical interposer 210 may include an array of V-grooves for aligning a plurality of optical fibers secured in place by the fiber lid 215 (and secured in place with epoxy, which may also secure the fiber lid 215), an array of mode converters (e.g., tapered waveguides), and a cavity for the electro-optical chip and/or laser chip. Light travelling in either direction may be coupled between first waveguides on the optical interposer 210 and second waveguides on the electro-optical chip 220; one end of each first waveguide may be sufficiently close to, and sufficiently well aligned and mode matched with, the corresponding end of a second waveguide for light to couple between the waveguides with minimum loss. If the electro-optical chip 220 includes a photodetector array, the PMD ASIC 105 may include an array of transimpedance amplifiers for amplifying the signals from the photodetectors; if the electro-optical chip 220 includes a modulator array, the PMD ASIC 105 may include an array of modulator drive circuits.

Figure 2C:
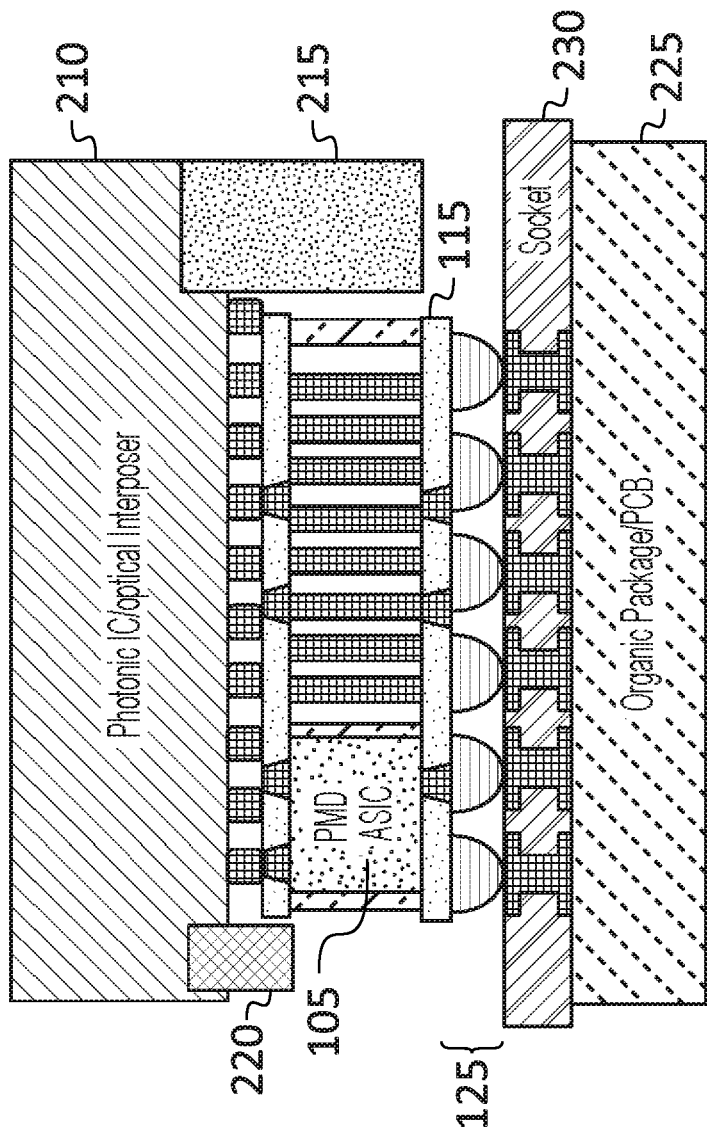
FIG. 2C is a side cross-sectional view of a portion of a system including a package on chip structure, according to an embodiment of the present disclosure.

In operation, if the electro-optical chip 220 includes a photodetector array, light arrives on the optical fibers, is coupled into the mode converters, propagates to the photodetector array and is converted to electrical signals, which are amplified by the PMD ASIC 105. If the electro-optical chip includes a modulator array, unmodulated light arrives on a first subset of the optical fibers, is coupled into a first subset of the mode converters, propagates to the modulator array and is modulated according to signals supplied by the PMD ASIC 105, and the modulated light propagates back through a second subset of the mode converters and is fed out through a second subset of the optical fibers. FIG. 2C shows the package on chip structure connected to an organic package or printed circuit board 225 through a socket 230 as described in further detail below.

Figure 3:
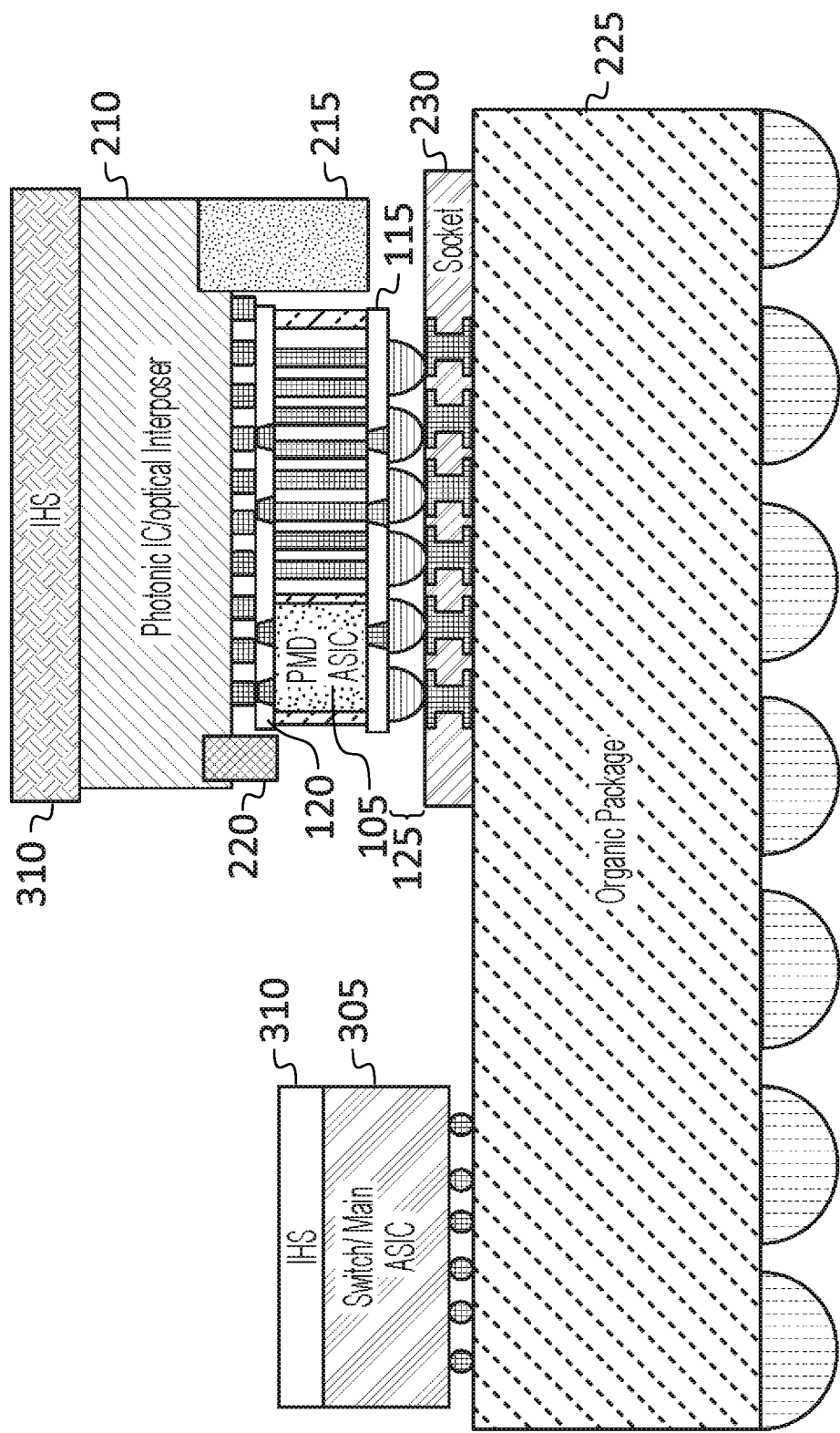
FIG. 3 is a side cross-sectional view of a portion of a system including a package on chip structure, according to an embodiment of the present disclosure.

The package on chip structure can be used for in-package integration of a switch and optics. FIG. 3 shows a system including the package on chip structure, connected to an organic package 225 (e.g., to a plurality of conductive pads on an upper surface of an organic substrate of the organic package 225), through a socket 230. The socket 230 may include an insulating layer of elastomer and a plurality of conductors extending through the layer of elastomer. The socket 230 may be, for example, any of several varieties of conductor-in-elastomer sockets available from Ironwood Electronics (ironwoodelectronics.com). In some embodiments, no socket 230 is used, and the package on chip structure is instead connected to the organic package 225 by a reflow process. Also on the organic package 225 is a switch ASIC 305, or "main" ASIC, which may be a CMOS ASIC providing packet switching functions. In some embodiments the organic package may include, instead of, or in addition to, the switch ASIC, one or more GPUs, FPGAs, or other integrated digital circuits. In some embodiments the switch ASIC 305 is connected directly to the organic package 225 as shown; in other embodiments it is connected directly to a high density package (e.g., it is packaged in a high density package) which is in turn connected to the organic package. A PHY circuit may be part of the switch ASIC 305, or it may be implemented in a separate PHY chip. For example, the interface between the switch ASIC 305 and each PMD ASIC 105 may be a high-speed serial interface, in which case the switch ASIC 305 may include a plurality of serializer/deserializer circuits, or the interface may be a parallel interface, in which case the circuits in the switch ASIC 305 for interfacing to each PMD ASIC 105 may be retiming circuits, or it may be the case that no additional circuits are needed in the switch ASIC 305 for interfacing to each PMD ASIC 105.

One or more integrated heat spreaders (IHS) 310 may provide thermal management (i) for the optical interposer 210, and (ii) through the optical interposer 210 and the array of short copper pillars with solder cap 130, for the PMD ASIC 105. The stack consisting of (i) the IHS 310 on the optical interposer, (ii) the fan out wafer level package, and (iii) the socket 230 may be secured to the organic package 225 by mechanical means such as a suitable clamp. The electrical path from the PMD ASIC 105 to the electro-optical chip 220 may be a short path (e.g., a path shorter than 500 microns or shorter than 300 microns) from the front surface of the PMD ASIC 105, through the lower RDL 120 (which is adjacent to the front surface of the PMD ASIC 105), through the short copper pillars with solder cap 130, and through a short conductive trace on the optical interposer 210, which may be connected to the electro-optical chip 220 by eutectic bonds. Heat may flow from the PMD ASIC 105 upward through the lower RDL 120, through the array of short copper pillars with solder cap 130, and through the optical interposer 210, to the IHS 310 on the optical interposer. Electrical connections between the switch ASIC 305 (or the PHY chip if present) and the package on chip structure may be formed by conductive traces in the organic package 225 and the conductors extending through the layer of elastomer within the socket 230. For example, high speed serial links between the switch ASIC 305 (or the PHY chip if present) and the PMD ASIC 105 may extend from the switch ASIC 305 (or the PHY chip if present) through traces in or on the organic package 225, through the socket 230, through the interconnect 125, through the layers of the an upper RDL 115, through the copper pillars with solder cap 130, through the lower RDL 120, and into the PMD ASIC 105. The total length of such connections may be scalable (e.g., by moving the package on chip structures nearer the switch ASIC 305, to the extent that there is sufficient clearance between the package on chip structures, and that heat dissipated by the switch ASIC does not degrade the performance of the package on chip structures to an unacceptable extent) to, for example, ultra short reach (USR), very short reach (VSR) or extra short reach (XSR) requirements.

Figure 4A:
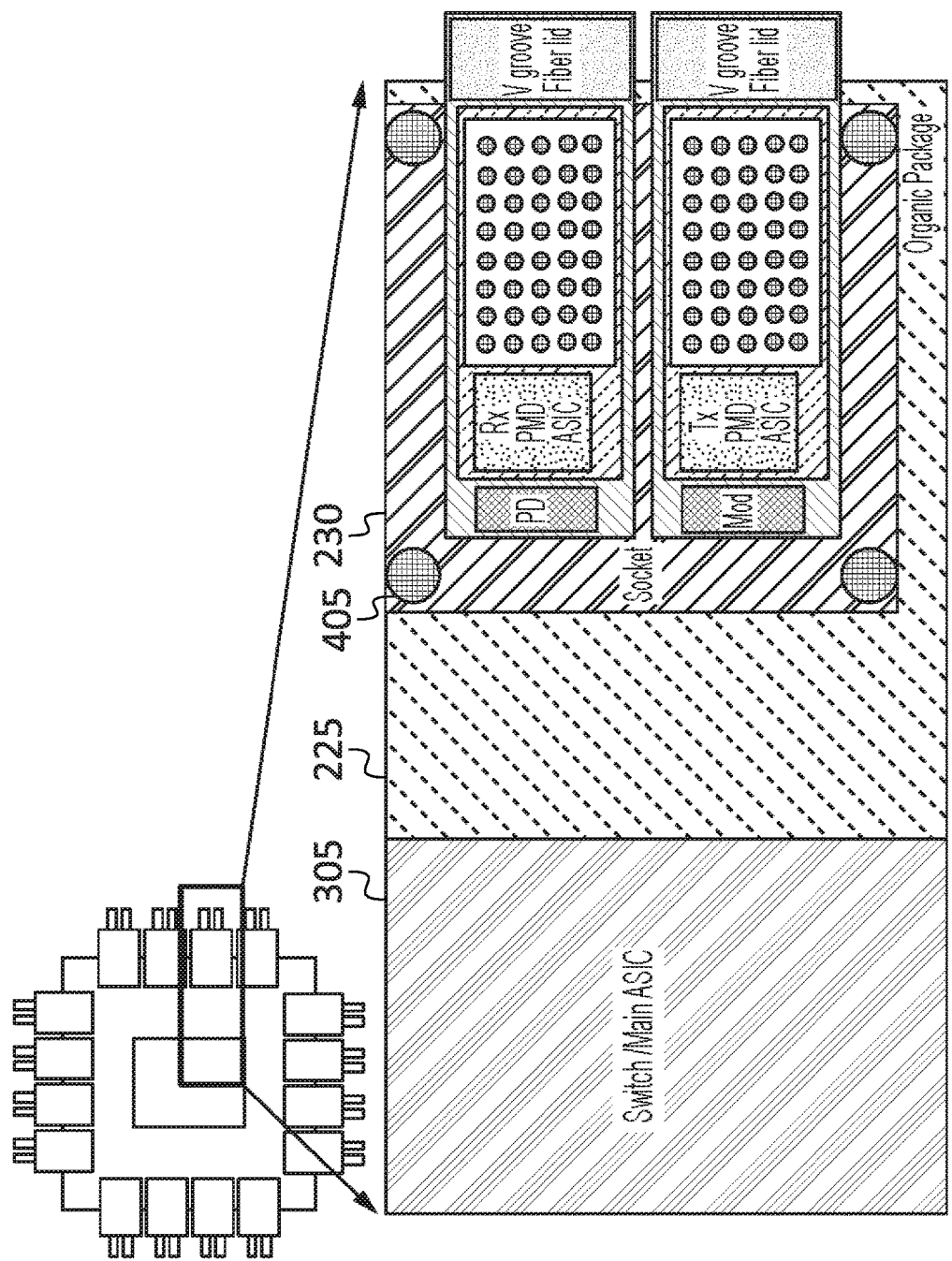
FIG. 4A is a top view of a portion of a system including a package on chip structure, according to an embodiment of the present disclosure.

FIG. 4A shows a system, according to one embodiment (which may be referred to as Light driver 1 (LD1), Option 1), in which separate receiver and transmitter package on chip structures are connected to the organic package 225, e.g., through a shared socket 230. In FIG. 4A the optical interposer 210 and the lower RDL 120 are drawn transparent so that the relative positions of parts below these elements may be seen. Alignment pins 405 may be used to maintain alignment between the package on chip structures and the organic package 225 or between the socket 230 and the organic package 225. In the embodiment of FIG. 4A, the separate receiver and transmitter package on chip structures may be separately tested before being installed on the socket 230.

Figure 4B:
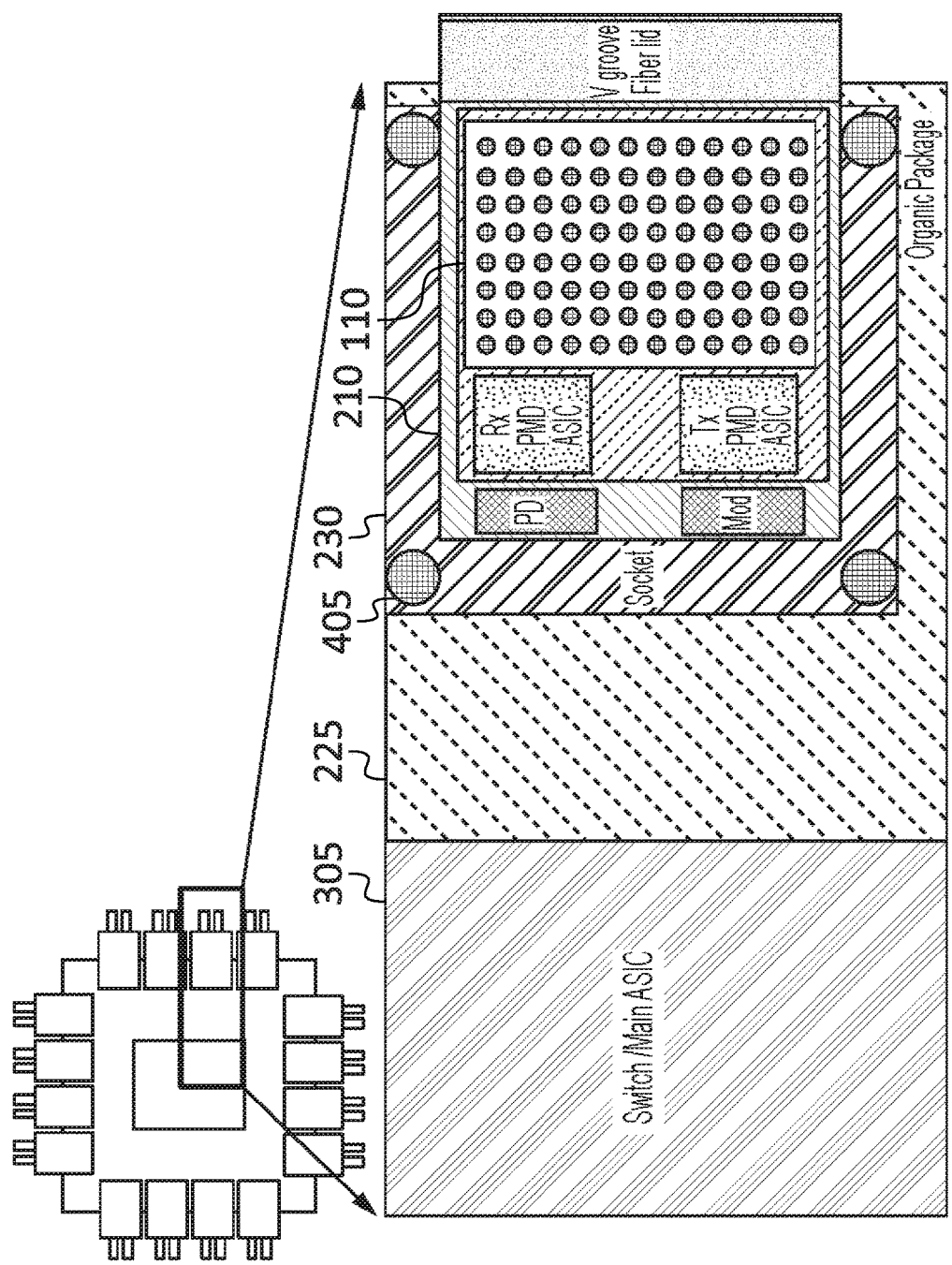
FIG. 4B is a top view of a portion of a system including a package on chip structure, according to an embodiment of the present disclosure.
Figure 4C:
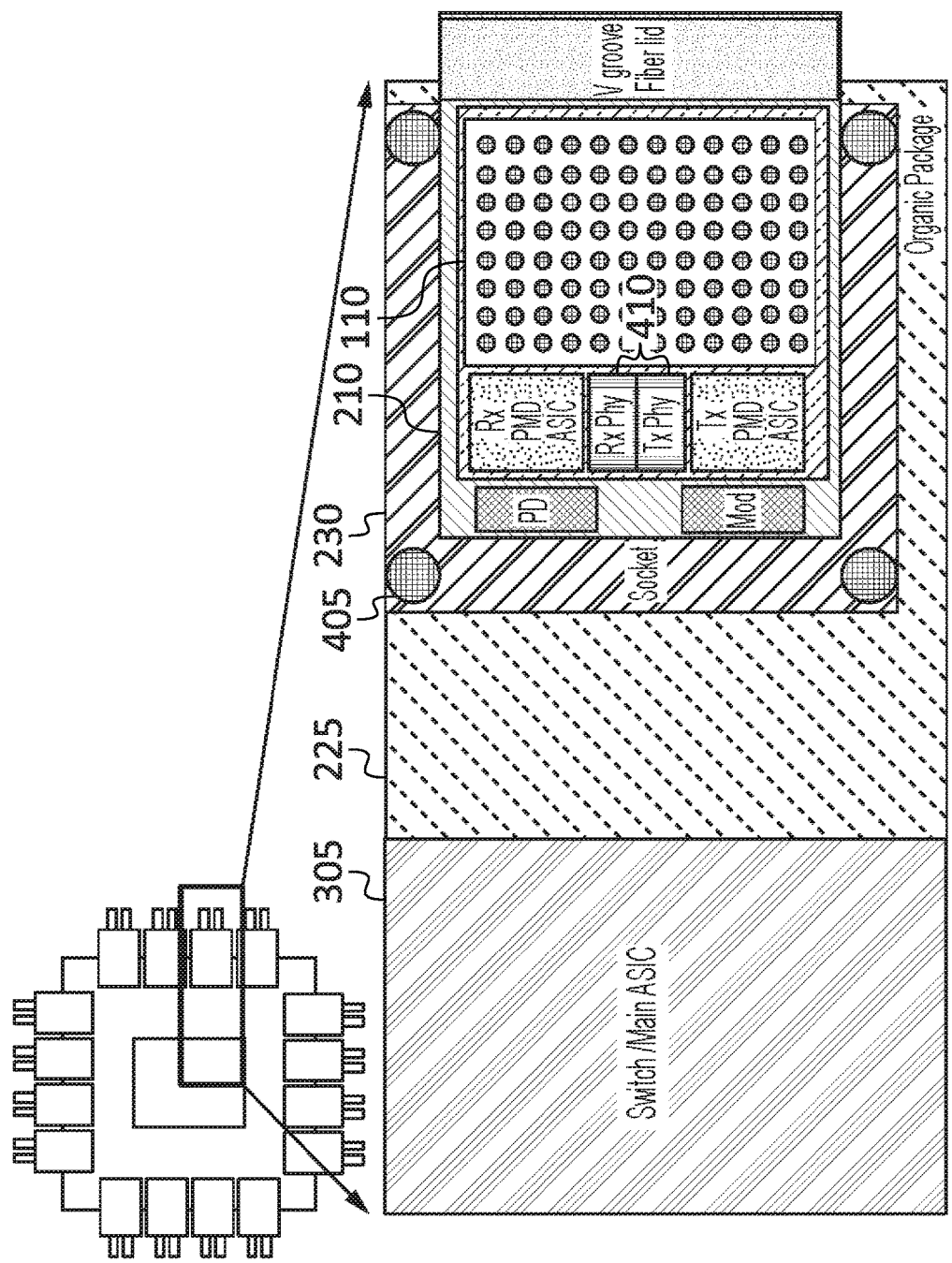
FIG. 4C is a top view of a portion of a system including a package on chip structure, according to an embodiment of the present disclosure.

FIG. 4B shows a system, according to one embodiment (which may be referred to as Light driver 1 (LD1), Option 2), in which a single package on chip structure, that includes separate receiver (photodetector ("PD")) and transmitter (modulator ("Mod")) electro-optical chips which share an optical interposer 210 and a via core 110, is connected to the switch ASIC 305 through a socket 230. FIG. 4C shows a system, according to one embodiment (which may be referred to as Light driver 2), differing from that of FIG. 4B in that the PHY circuits 410 (a transmit PHY circuit ("Tx Phy") and a receive PHY circuit ("Rx Phy")) are integrated into the package on chip structure. The embodiments of FIGS. 4B and 4C may have the advantage, over the embodiment of FIG. 4A, of having lower fabrication cost; the embodiment of FIG. 4A may have the advantage of enabling independent replacement of the separate receiver and transmitter package on chip structures.

Figure 5A:
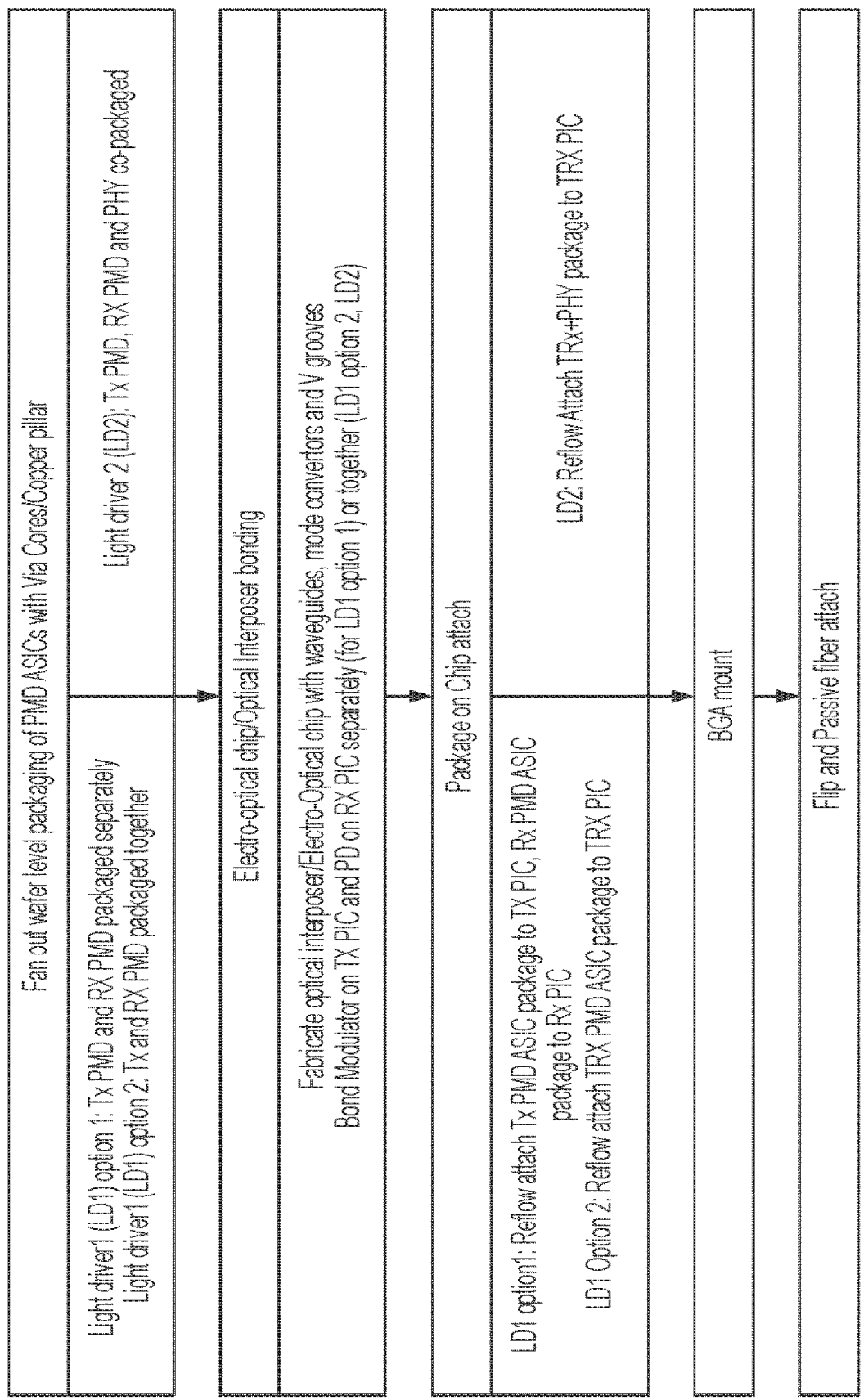
FIG. 5A is flow chart of a method for fabricating a package, according to an embodiment of the present disclosure.
Figure 5B:
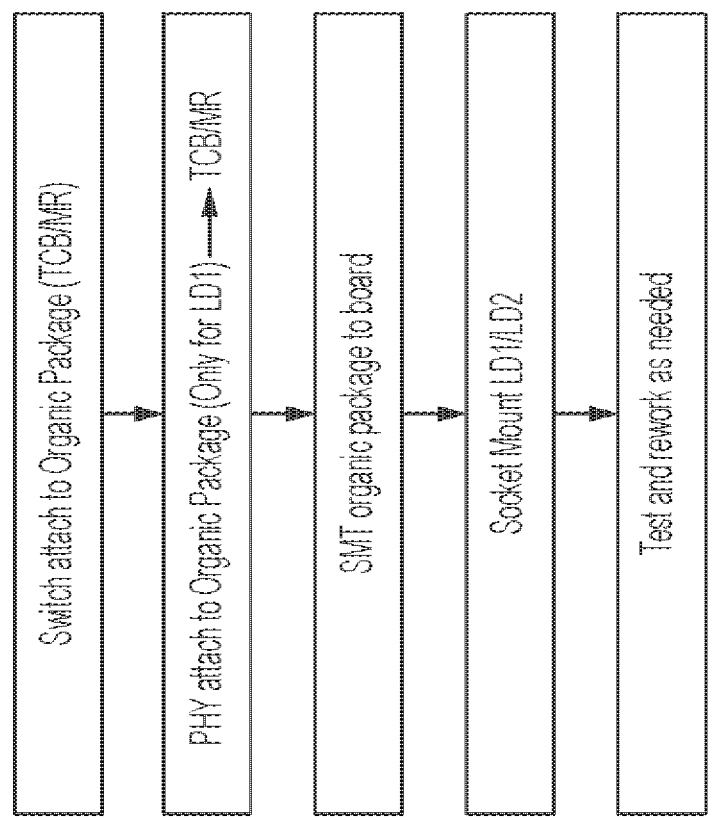
FIG. 5B is flow chart of a method for fabricating a package, according to an embodiment of the present disclosure.
Figure 6A:
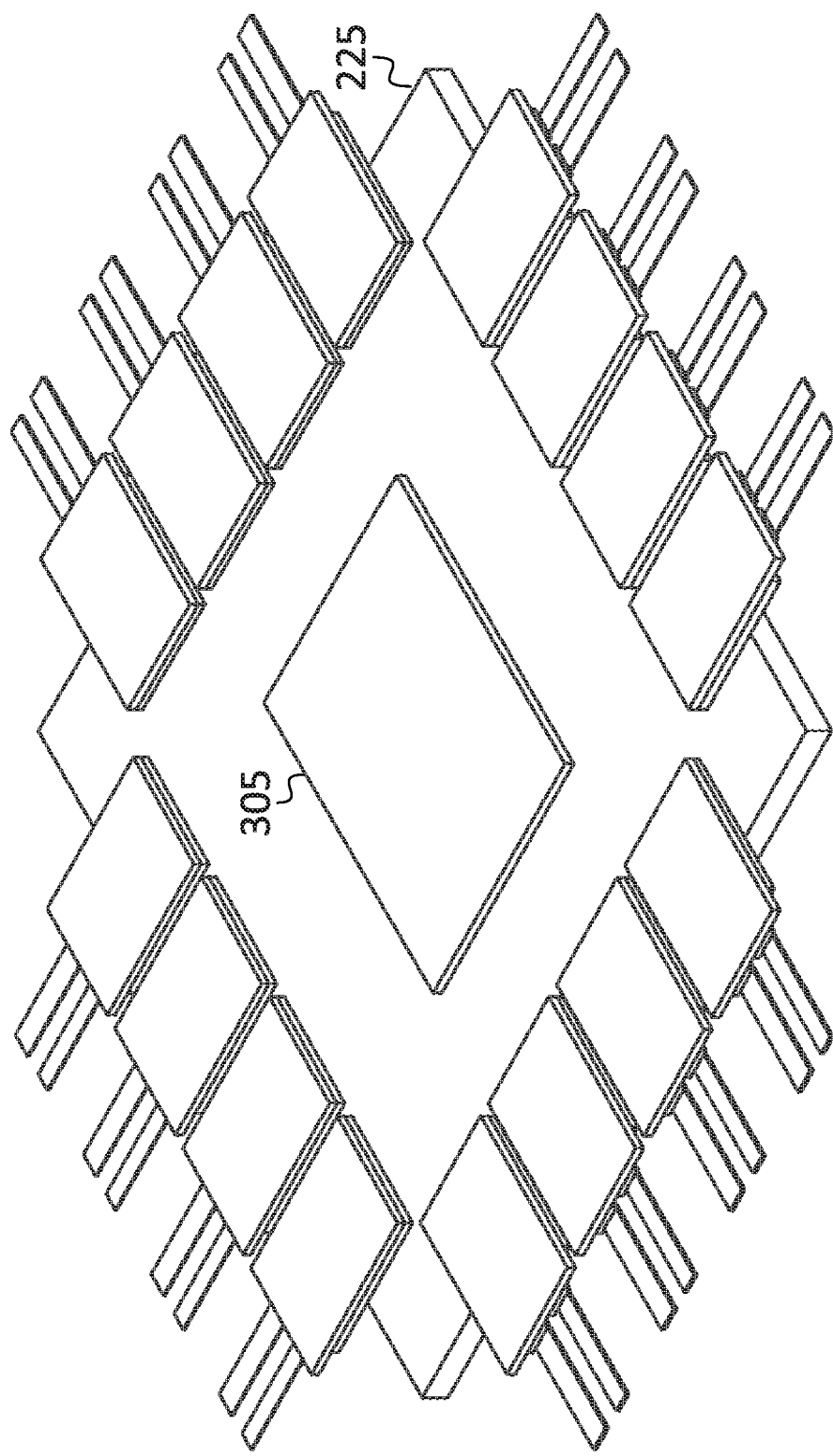
FIG. 6A is a perspective view of a system including a package on chip structure, according to an embodiment of the present disclosure.
Figure 6B:
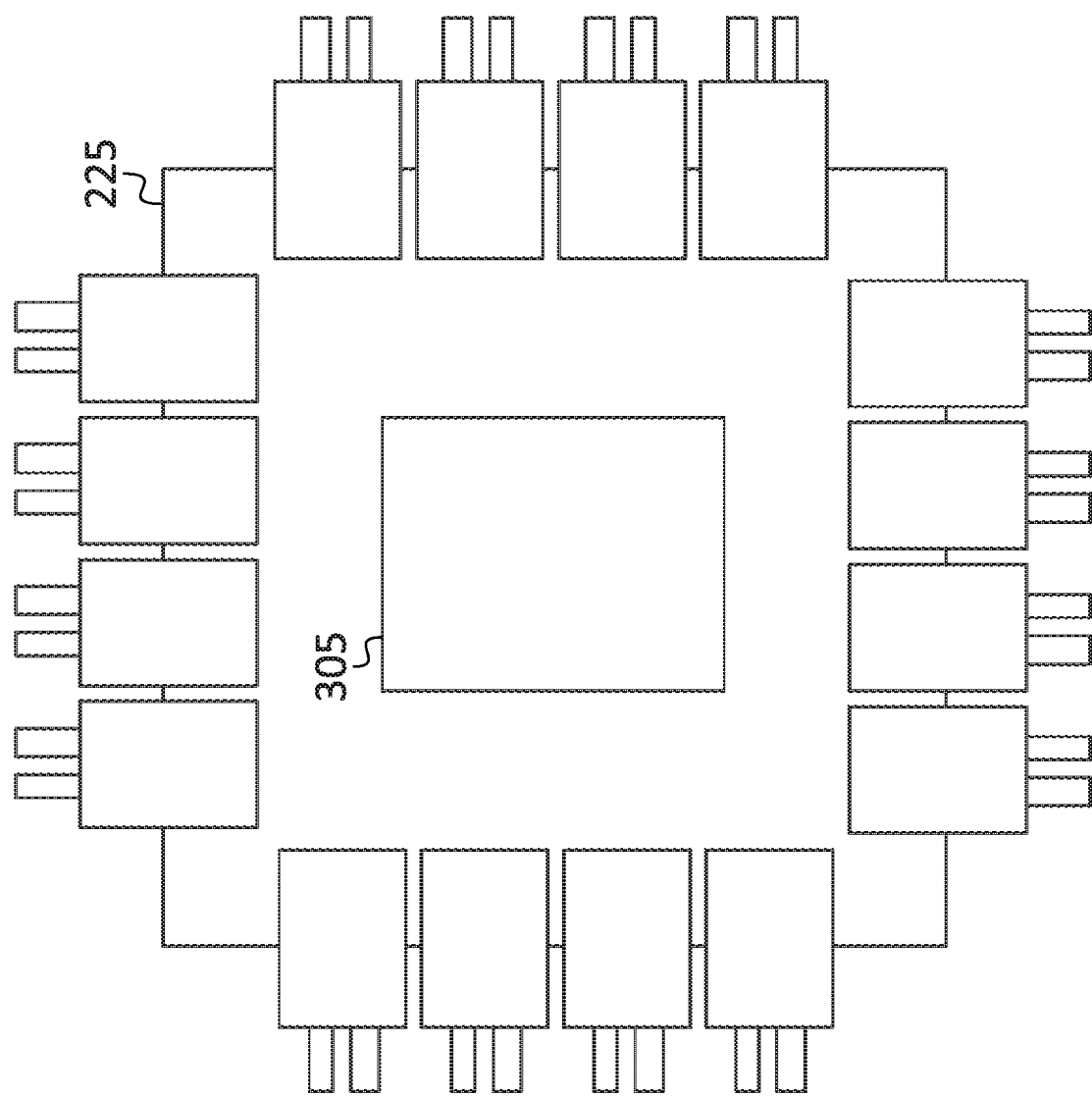
FIG. 6B is a top view of a system including a package on chip structure, according to an embodiment of the present disclosure.

FIG. 5A shows a method, according to some embodiments, for fabricating a package on chip structure, or "light driver". FIG. 5B shows a system integration method, according to some embodiments. FIGS. 6A and 6B show an integrated system, according to some embodiments including co-packaged switch ASIC 305 and package on chip structures for up to 51.2 Tb/s operation.

Figure 7A:
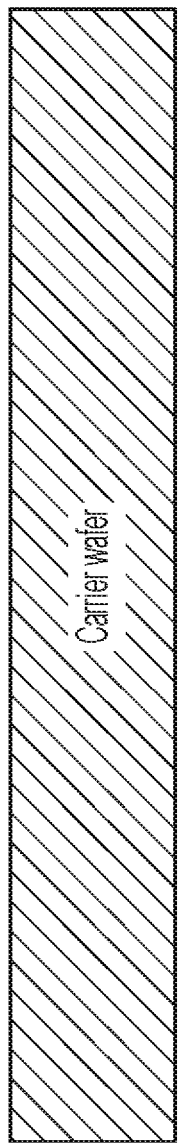
FIG. 7A is a side cross-sectional view of an intermediate product in the fabrication of a package, according to an embodiment of the present disclosure.
Figure 7B:
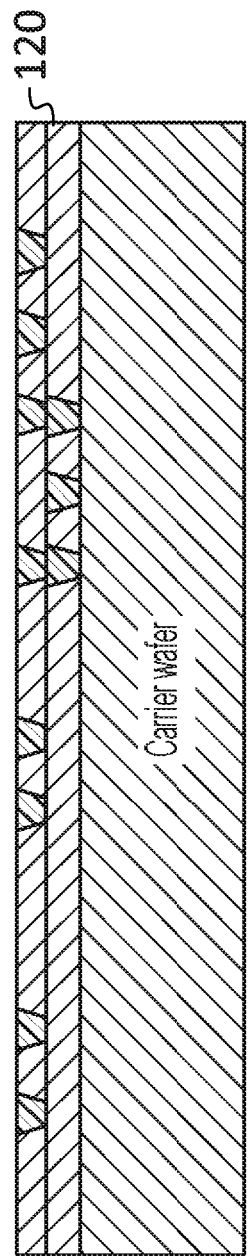
FIG. 7B is a side cross-sectional view of an intermediate product in the fabrication of a package, according to an embodiment of the present disclosure.
Figure 7C:
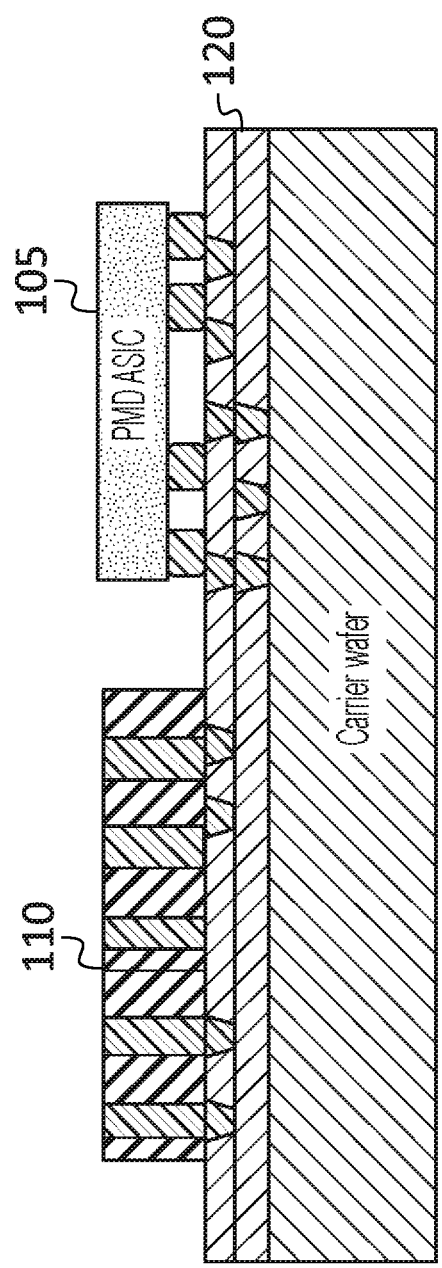
FIG. 7C is a side cross-sectional view of an intermediate product in the fabrication of a package, according to an embodiment of the present disclosure.
Figure 7D:
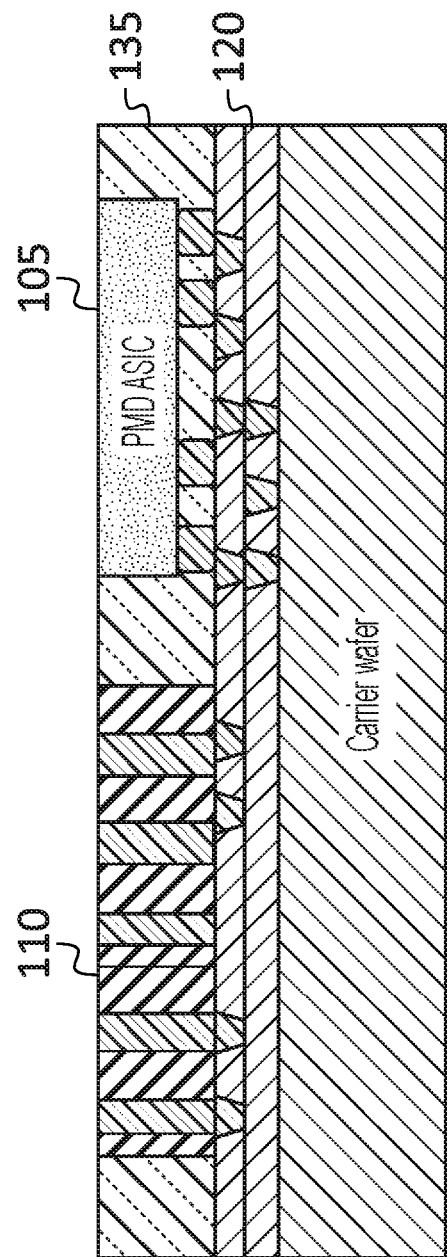
FIG. 7D is a side cross-sectional view of an intermediate product in the fabrication of a package, according to an embodiment of the present disclosure.
Figure 7E:
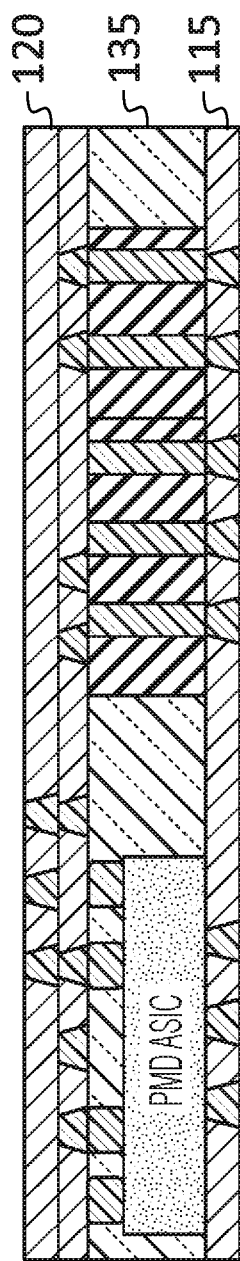
FIG. 7E is a side cross-sectional view of an intermediate product in the fabrication of a package, according to an embodiment of the present disclosure.
Figure 7F:
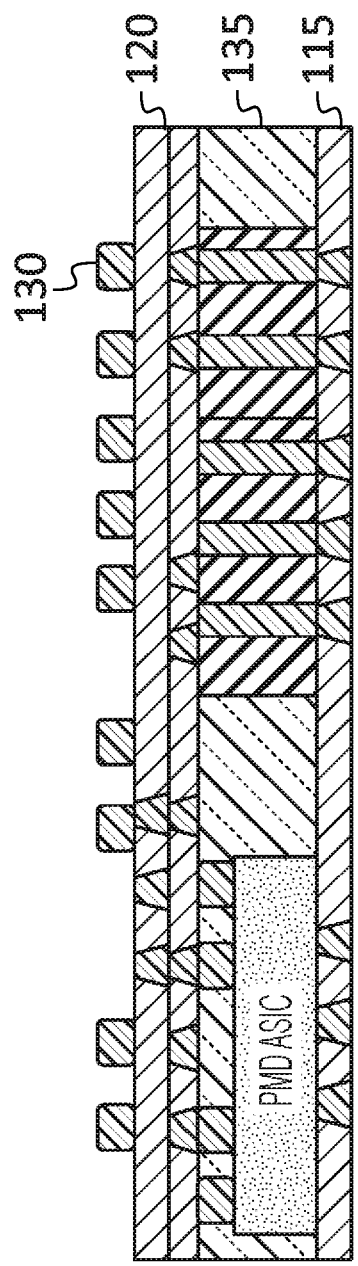
FIG. 7F is a side cross-sectional view of an intermediate product in the fabrication of a package, according to an embodiment of the present disclosure.
Figure 7G:
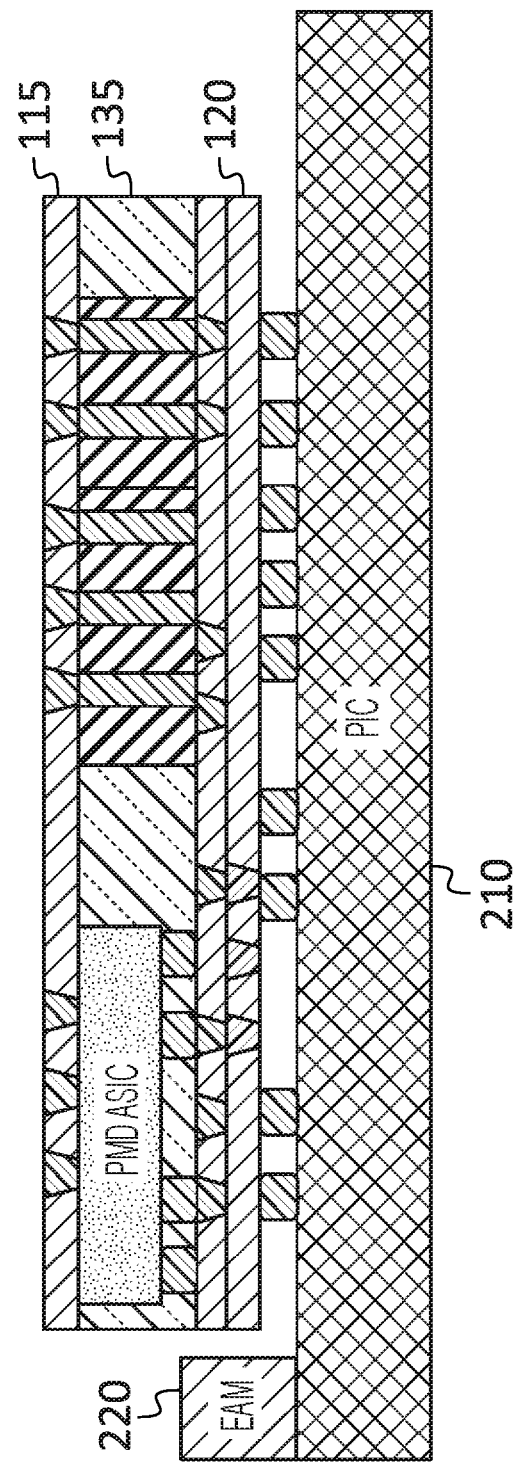
FIG. 7G is a side cross-sectional view of an intermediate product in the fabrication of a package, according to an embodiment of the present disclosure.
Figure 7H:
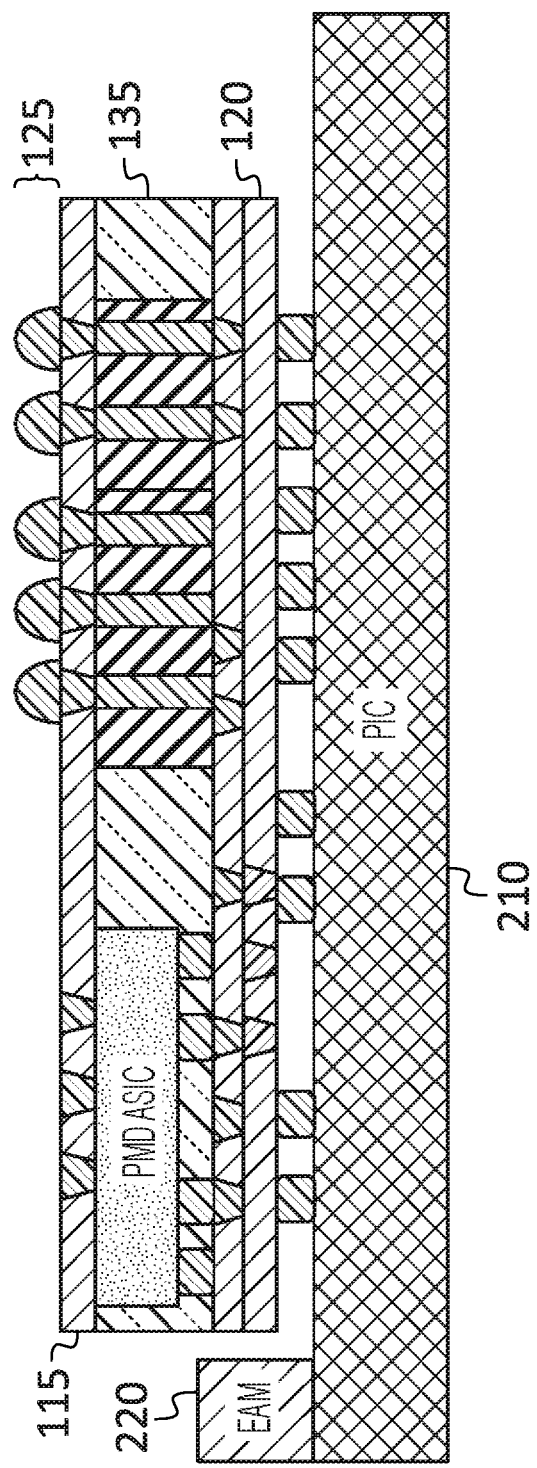
FIG. 7H is a side cross-sectional view of an intermediate product in the fabrication of a package, according to an embodiment of the present disclosure.
Figure 7I:
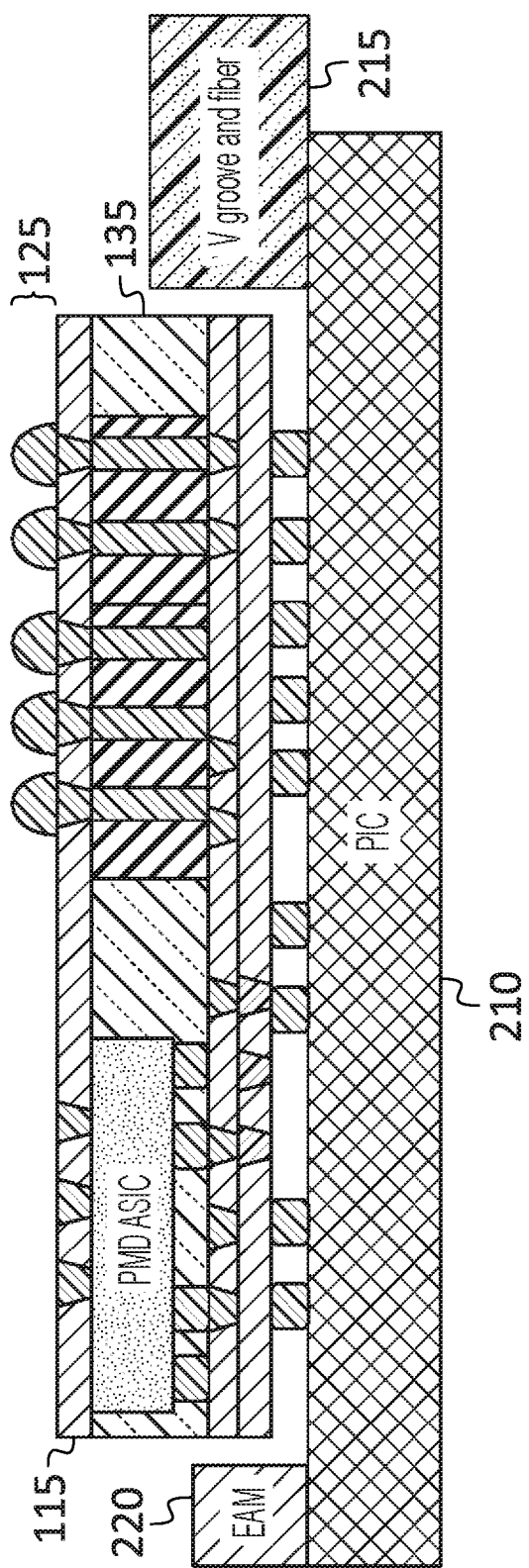
FIG. 7I is a side cross-sectional view of an intermediate product in the fabrication of a package, according to an embodiment of the present disclosure.

FIGS. 7A-7I show a method for fabricating a fan out wafer level package, securing it to a subassembly including an optical interposer and an electro-optical chip, and attaching optical fibers, according to some embodiments. The lower RDL 120 is formed (e.g., by spin coating) on a carrier wafer (FIGS. 7A and 7B), the via core 110 and PMD ASIC 105 are attached to the lower RDL 120 (FIG. 7C), the overmold 135 is molded onto the intermediate product and ground flat (FIG. 7D), the an upper RDL 115 is formed on the upper surface of the overmold 135 and the intermediate product is detaped from the carrier wafer and the intermediate product is inverted (or "flipped") (FIG. 7E). Copper pillars with solder cap 130 are formed (FIG. 7F), the intermediate product is inverted again and attached to the PIC in a "package on chip attach" operation (FIG. 7G), the interconnect 125 (e.g., balls forming a ball grid array) is formed (FIG. 7H), and optical fibers are placed in the V-grooves (e.g., passively aligned to the optical interposer 210) and the fiber lid 215 is secured in place (FIG. 7I).

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an electro-optical package and method of fabrication have been specifically described and illustrated herein, many modifications and variations will be apparent to those skilled in the art. Accordingly, it is to be understood that an electro-optical package and method of fabrication according to principles of this disclosure may be embodied other than as specifically described herein. The invention is also defined in the following claims, and equivalents thereof.

What is claimed is:
1. A system, comprising:
a first electro-optical chip coupled to an array of optical fibers; and
a first physical medium dependent integrated circuit coupled to the first electro-optical chip;
a first optical interposer chip coupled to the array of optical fibers; and
a first redistribution layer between the first physical medium dependent integrated circuit and the first optical interposer chip,
the first electro-optical chip being coupled to the array of optical fibers through the first optical interposer chip,
the first optical interposer chip comprising:
one or more waveguides; and
one or more conductive traces,
the one or more waveguides being on a first surface of the first optical interposer chip,
the one or more conductive traces being on the first surface of the first optical interposer chip,
the first surface of the first optical interposer chip being a surface of the first optical interposer chip facing the first physical medium dependent integrated circuit, and
the first redistribution layer comprising:
a layer of insulating material;
one or more conductive traces; and
one or more vias.
2. The system of claim 1, further comprising a first via core on the first redistribution layer,
wherein the first via core comprises a plurality of vias in a dielectric, wherein a via from among the plurality of vias extends from a first surface of the first via core to a second surface of the first via core, and
wherein the first surface of the first via core is a surface of the first via core facing the first redistribution layer.

3. The system of claim 2, further comprising:
a second redistribution layer, parallel to the first redistribution layer, the first physical medium dependent integrated circuit being between the first redistribution layer and the second redistribution layer; and
a first array of conductors secured to the first redistribution layer and to the first optical interposer chip,
wherein the first via core is between the first redistribution layer and the second redistribution layer.

4. The system of claim 3, wherein the first physical medium dependent integrated circuit and the first via core are part of a single silicon integrated circuit.

5. The system of claim 3, further comprising an overmold between the first redistribution layer and the second redistribution layer, the overmold encapsulating the first physical medium dependent integrated circuit and the first via core.

6. The system of claim 3, wherein the first optical interposer chip comprises an array of V-grooves, each optical fiber of the array of optical fibers being in a respective V-groove.

7. The system of claim 3, further comprising:
a second array of conductors on an outer surface of the second redistribution layer; and
an organic substrate having, on its surface, a plurality of conductive pads, and a socket, between the second array of conductors and the conductive pads.

8. The system of claim 7, wherein the socket comprises an insulating layer of elastomer and a plurality of conductors extending through the insulating layer of elastomer.

9. The system of claim 7, wherein the first electro-optical chip comprises a modulator, the system further comprising:
a second electro-optical chip comprising a photodetector; and
a second physical medium dependent integrated circuit coupled to the second electro-optical chip.

10. The system of claim 9, wherein:
a conductive path between the first physical medium dependent integrated circuit and the organic substrate includes a portion in a conductor of the socket; and
a conductive path between the second physical medium dependent integrated circuit and the organic substrate includes a portion in a conductor of the socket.

11. The system of claim 9, wherein the second electro-optical chip is coupled to the array of optical fibers through the first optical interposer chip.

12. The system of claim 11, wherein:
a conductive path between the first physical medium dependent integrated circuit and the organic substrate includes a portion in a conductor of the first via core; and
a conductive path between the second physical medium dependent integrated circuit and the organic substrate includes a portion in a conductor of the first via core.

13. The system of claim 9, further comprising a second optical interposer chip, wherein the second electro-optical chip is coupled to the array of optical fibers through the second optical interposer chip.

14. The system of claim 13, further comprising a second via core, wherein:
a conductive path between the first physical medium dependent integrated circuit and the organic substrate includes a portion in a conductor of the first via core; and
a conductive path between the second physical medium dependent integrated circuit and the organic substrate includes a portion in a conductor of the second via core.

15. The system of claim 1, wherein a conductive path extending from the first electro-optical chip to the first physical medium dependent integrated circuit has a length of less than 500 microns.

16. The system of claim 15, wherein the conductive path extending from the first electro-optical chip to the first physical medium dependent integrated circuit has a length of less than 350 microns.

17. A system comprising:
a first redistribution layer;
a via core attached to the first redistribution layer;
a physical medium dependent integrated circuit attached to the first redistribution layer;
an overmold on the via core and on the physical medium dependent integrated circuit; and
a second redistribution layer on an upper surface of the overmold.

18. The system of claim 17, further comprising an array of conductors on the second redistribution layer.

19. The system of claim 18, further comprising an electro-optical chip attached to an optical interposer chip comprising a plurality of conductive traces, and a plurality of V-grooves.

20. The system of claim 19, further comprising an optical fiber in one of the plurality of V-grooves.

21. The system of claim 17,
wherein the via core comprises a plurality of vias in a dielectric,
wherein a via from among the plurality of vias extends from a first surface of the via core to a second surface of the via core, and
wherein the first surface of the via core is a surface of the via core facing the first redistribution layer.

* * * * *